(12) United States Patent
Schuh et al.

(10) Patent No.: US 12,073,873 B2
(45) Date of Patent: Aug. 27, 2024

(54) DYNAMIC BUFFER LIMIT FOR AT-RISK DATA

(71) Applicant: Micron Technology, Inc., Boise, ID (US)

(72) Inventors: Karl D. Schuh, Santa Cruz, CA (US); William Richard Akin, Morgan Hill, CA (US)

(73) Assignee: MICRON TECHNOLOGY, INC., Boise, ID (US)

( * ) Notice: Subject to any disclaimer, the term of this patent is extended or adjusted under 35 U.S.C. 154(b) by 11 days.

(21) Appl. No.: 17/462,870

(22) Filed: Aug. 31, 2021

(65) Prior Publication Data

US 2023/0064781 A1   Mar. 2, 2023

(51) Int. Cl.
| | |
|---|---|
| *G11C 7/10* | (2006.01) |
| *G11C 11/4074* | (2006.01) |
| *G11C 11/4076* | (2006.01) |
| *G11C 11/4093* | (2006.01) |
| *G11C 11/4096* | (2006.01) |

(52) U.S. Cl.
CPC ...... *G11C 11/4093* (2013.01); *G11C 11/4074* (2013.01); *G11C 11/4076* (2013.01); *G11C 11/4096* (2013.01)

(58) Field of Classification Search
CPC ............ G11C 11/4093; G11C 11/4074; G11C 11/4076; G11C 11/4096
See application file for complete search history.

(56) References Cited

U.S. PATENT DOCUMENTS

| | | | |
|---|---|---|---|
| 2008/0189452 A1* | 8/2008 | Merry | G11B 19/044 |
| | | | 710/56 |
| 2010/0202240 A1 | 8/2010 | Moshayedi et al. | |
| 2015/0363272 A1* | 12/2015 | Zheng | G06F 11/1471 |
| | | | 714/19 |
| 2019/0087332 A1 | 3/2019 | Jun et al. | |
| 2019/0121558 A1 | 4/2019 | Lee et al. | |
| 2019/0310918 A1* | 10/2019 | Frolikov | G06F 11/1446 |
| 2020/0089610 A1* | 3/2020 | Stonelake | G06F 12/0897 |
| 2020/0174935 A1* | 6/2020 | Crowley | G06F 12/128 |
| 2021/0089225 A1* | 3/2021 | Boyd | G06F 3/0647 |
| 2021/0096756 A1* | 4/2021 | Rajgopal | G06F 3/0616 |
| 2021/0141546 A1 | 5/2021 | Jung et al. | |
| 2021/0257034 A1 | 8/2021 | Lee et al. | |
| 2021/0357324 A1* | 11/2021 | Walker | G06F 12/12 |
| 2022/0269434 A1* | 8/2022 | Shin | G06F 3/0656 |

FOREIGN PATENT DOCUMENTS

| | | |
|---|---|---|
| KR | 10-2019-0032716 A | 3/2019 |
| KR | 10-2019-0043868 A | 4/2019 |

OTHER PUBLICATIONS

International Search Report and Written Opinion, PCT App. No. PCT/US2022/041709, Dec. 8, 2022, 9 pages.

\* cited by examiner

*Primary Examiner* — Mushfique Siddique
(74) *Attorney, Agent, or Firm* — NICHOLSON DE VOS WEBSTER & ELLIOTT LLP

(57) ABSTRACT

Exemplary methods, apparatuses, and systems include allotting an initial amount of volatile memory to a write buffer. The write buffer stores batches of data to be written to non-volatile memory. In response to detecting a trigger to update the write buffer configuration, the volatile memory allotted to the write buffer is reduced.

20 Claims, 4 Drawing Sheets

DYNAMIC BUFFER LIMIT FOR AT-RISK DATA

TECHNICAL FIELD

The present disclosure generally relates to managing a buffer used to aggregate data to be written to a memory subsystem, and more specifically, relates to dynamically adjusting the at-risk data limit on the buffer.

BACKGROUND ART

A memory subsystem can include one or more memory devices that store data. The memory devices can be, for example, non-volatile memory devices and volatile memory devices. In general, a host system can utilize a memory subsystem to store data at the memory devices and to retrieve data from the memory devices.

BRIEF DESCRIPTION OF THE DRAWINGS

The disclosure will be understood more fully from the detailed description given below and from the accompanying drawings of various embodiments of the disclosure. The drawings, however, should not be taken to limit the disclosure to the specific embodiments, but are for explanation and understanding only.

DETAILED DESCRIPTION

Figure 1:
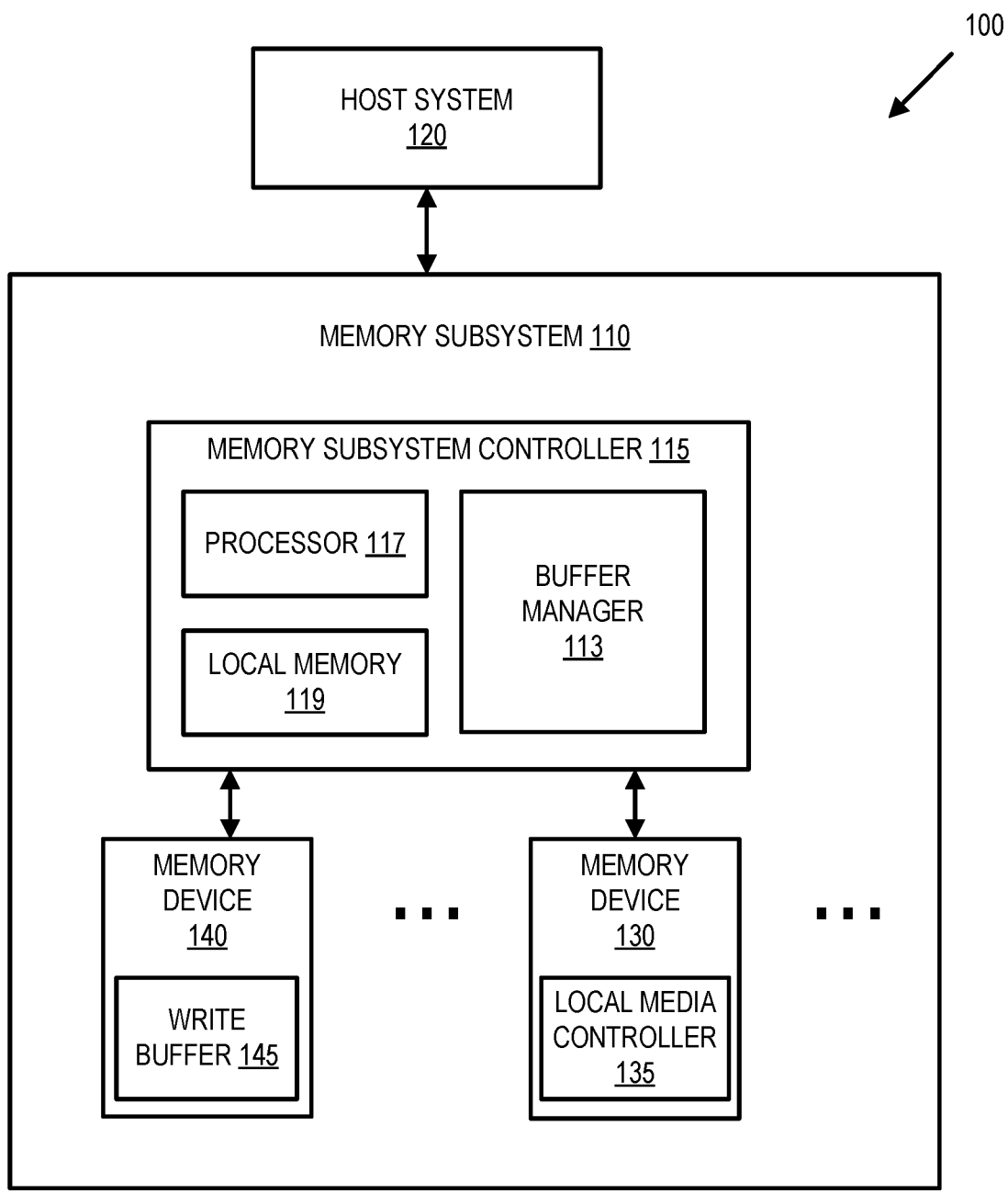
FIG. 1 illustrates an example computing system that includes a memory subsystem in accordance with some embodiments of the present disclosure.

Aspects of the present disclosure are directed to managing a write buffer in a memory subsystem. A memory subsystem can be a storage device, a memory module, or a hybrid of a storage device and memory module. Examples of storage devices and memory modules are described below in conjunction with FIG. 1. In general, a host system can utilize a memory subsystem that includes one or more components, such as memory devices that store data. The host system can provide data to be stored at the memory subsystem and can request data to be retrieved from the memory subsystem.

A memory device can be a non-volatile memory device. A non-volatile memory device is a package of one or more dice. One example of non-volatile memory devices is a negative-and (NAND) memory device. Other examples of non-volatile memory devices are described below in conjunction with FIG. 1. The dice in the packages can be assigned to one or more channels for communicating with a memory subsystem controller. Each die can consist of one or more planes. Planes can be grouped into logic units (LUN). For some types of non-volatile memory devices (e.g., NAND memory devices), each plane consists of a set of physical blocks, which are groups of memory cells to store data. A cell is an electronic circuit that stores information.

Depending on the cell type, a cell can store one or more bits of binary information, and has various logic states that correlate to the number of bits being stored. The logic states can be represented by binary values, such as "0" and "1", or combinations of such values. There are various types of cells, such as single-level cells (SLCs), multi-level cells (MLCs), triple-level cells (TLCs), and quad-level cells (QLCs). For example, a SLC can store one bit of information and has two logic states.

Memory subsystems use a write buffer to aggregate an amount of data (e.g., a minimum write size) before writing the data to non-volatile memory. Additionally, a write buffer can help regulate the write speed in order to manage the wear on the underlying non-volatile memory as well as minimize the risk of losing data, e.g., due to an asynchronous power loss. For example, the write buffer can be implemented in volatile memory and, following a loss of power, a memory subsystem may have a limited amount of additional time, through the use of capacitors or another limited form of power backup, to commit buffered data to non-volatile memory. Given that capacitors degrade over time, memory subsystem designs use a degraded state (e.g., an end-of-life capacity calculation based upon degraded capacitors) when determining the amount of additional time capacitors can provide as backup power. At the beginning of the life of the capacitors (prior to degradation), use of a degraded state (e.g., the end-of-life capacity calculation) to limit the size of the write buffer can result in an overly conservative throttling of the write speed for the memory subsystem. In turn, this can limit heavy write demands that are common at the beginning of the life of a memory subsystem, such as the installation of an operating system.

Aspects of the present disclosure address the above and other deficiencies by managing the write buffer limit dynamically rather than setting it to a static value based upon a degraded state of backup capacitors. In particular, a memory subsystem can use a greater at-risk data limit for a write buffer during an initial period and reduce the limit size in response to a manual or automatic trigger. As a result, at the beginning of life for a memory subsystem when capacitors providing backup power have yet to reach the assumed degradation state, a memory subsystem can provide a burst capability to allow for faster initial write demands without increasing the risk of data loss due to a power loss.

FIG. 1 illustrates an example computing system 100 that includes a memory subsystem 110 in accordance with some embodiments of the present disclosure. The memory subsystem 110 can include media, such as one or more volatile memory devices (e.g., memory device 140), one or more non-volatile memory devices (e.g., memory device 130), or a combination of such.

A memory subsystem 110 can be a storage device, a memory module, or a hybrid of a storage device and memory module. Examples of a storage device include a solid-state drive (SSD), a flash drive, a universal serial bus (USB) flash drive, an embedded Multi-Media Controller (eMMC) drive, a Universal Flash Storage (UFS) drive, a secure digital (SD) card, and a hard disk drive (HDD). Examples of memory modules include a dual in-line memory module (DIMM), a small outline DIMM (SO-DIMM), and various types of non-volatile dual in-line memory module (NVDIMM).

The computing system 100 can be a computing device such as a desktop computer, laptop computer, network server, mobile device, a vehicle (e.g., airplane, drone, train, automobile, or other conveyance), Internet of Things (IoT) enabled device, embedded computer (e.g., one included in a vehicle, industrial equipment, or a networked commercial device), or such computing device that includes memory and a processing device.

The computing system 100 can include a host system 120 that is coupled to one or more memory subsystems 110. In some embodiments, the host system 120 is coupled to different types of memory subsystems 110. FIG. 1 illustrates one example of a host system 120 coupled to one memory subsystem 110. As used herein, "coupled to" or "coupled with" generally refers to a connection between components, which can be an indirect communicative connection or direct communicative connection (e.g., without intervening components), whether wired or wireless, including connections such as electrical, optical, magnetic, etc.

The host system 120 can include a processor chipset and a software stack executed by the processor chipset. The processor chipset can include one or more cores, one or more caches, a memory controller (e.g., NVDIMM controller), and a storage protocol controller (e.g., PCIe controller, SATA controller). The host system 120 uses the memory subsystem 110, for example, to write data to the memory subsystem 110 and read data from the memory subsystem 110.

The host system 120 can be coupled to the memory subsystem 110 via a physical host interface. Examples of a physical host interface include, but are not limited to, a serial advanced technology attachment (SATA) interface, a peripheral component interconnect express (PCIe) interface, universal serial bus (USB) interface, Fibre Channel, Serial Attached SCSI (SAS), Small Computer System Interface (SCSI), a double data rate (DDR) memory bus, a dual in-line memory module (DIMM) interface (e.g., DIMM socket interface that supports Double Data Rate (DDR)), Open NAND Flash Interface (ONFI), Double Data Rate (DDR), Low Power Double Data Rate (LPDDR), or any other interface. The physical host interface can be used to transmit data between the host system 120 and the memory subsystem 110. The host system 120 can further utilize an NVM Express (NVMe) interface to access components (e.g., memory devices 130) when the memory subsystem 110 is coupled with the host system 120 by the PCIe interface. The physical host interface can provide an interface for passing control, address, data, and other signals between the memory subsystem 110 and the host system 120. FIG. 1 illustrates a memory subsystem 110 as an example. In general, the host system 120 can access multiple memory subsystems via a same communication connection, multiple separate communication connections, and/or a combination of communication connections.

The memory devices 130, 140 can include any combination of the different types of non-volatile memory devices and/or volatile memory devices. The volatile memory devices (e.g., memory device 140) can be, but are not limited to, random access memory (RAM), such as dynamic random access memory (DRAM) and synchronous dynamic random access memory (SDRAM). In one embodiment, a non-volatile memory device 140 includes or otherwise implements a write buffer 145 for aggregating data to be written to volatile memory device(s) 130 and managing the speed of write commands received from, e.g., a host system 120.

Some examples of non-volatile memory devices (e.g., memory device 130) include negative-and (NAND) type flash memory and write-in-place memory, such as a three-dimensional cross-point ("3D cross-point") memory device, which is a cross-point array of non-volatile memory cells. A cross-point array of non-volatile memory can perform bit storage based on a change of bulk resistance, in conjunction with a stackable cross-gridded data access array. Additionally, in contrast to many flash-based memories, cross-point non-volatile memory can perform a write in-place operation, where a non-volatile memory cell can be programmed without the non-volatile memory cell being previously erased. NAND type flash memory includes, for example, two-dimensional NAND (2D NAND) and three-dimensional NAND (3D NAND).

Although non-volatile memory devices such as NAND type memory (e.g., 2D NAND, 3D NAND) and 3D cross-point array of non-volatile memory cells are described, the memory device 130 can be based on any other type of non-volatile memory, such as read-only memory (ROM), phase change memory (PCM), self-selecting memory, other chalcogenide based memories, ferroelectric transistor random-access memory (FeTRAM), ferroelectric random access memory (FeRAM), magneto random access memory (MRAM), Spin Transfer Torque (STT)-MRAM, conductive bridging RAM (CBRAM), resistive random access memory (RRAM), oxide based RRAM (OxRAM), negative-or (NOR) flash memory, and electrically erasable programmable read-only memory (EEPROM)

A memory subsystem controller 115 (or controller 115 for simplicity) can communicate with the memory devices 130 to perform operations such as reading data, writing data, or erasing data at the memory devices 130 and other such operations (e.g., in response to commands scheduled on a command bus by controller 115). The memory subsystem controller 115 can include hardware such as one or more integrated circuits and/or discrete components, a buffer memory, or a combination thereof. The hardware can include digital circuitry with dedicated (i.e., hard-coded) logic to perform the operations described herein. The memory subsystem controller 115 can be a microcontroller, special purpose logic circuitry (e.g., a field programmable gate array (FPGA), an application specific integrated circuit (ASIC), etc.), or another suitable processor.

The memory subsystem controller 115 can include a processing device 117 (processor) configured to execute instructions stored in a local memory 119. In the illustrated example, the local memory 119 of the memory subsystem controller 115 includes an embedded memory configured to store instructions for performing various processes, operations, logic flows, and routines that control operation of the memory subsystem 110, including handling communications between the memory subsystem 110 and the host system 120.

In some embodiments, the local memory 119 can include memory registers storing memory pointers, fetched data, etc. The local memory 119 can also include read-only memory (ROM) for storing micro-code. While the example memory subsystem 110 in FIG. 1 has been illustrated as including the memory subsystem controller 115, in another embodiment of the present disclosure, a memory subsystem 110 does not include a memory subsystem controller 115, and can instead rely upon external control (e.g., provided by an external host, or by a processor or controller separate from the memory subsystem 110).

In general, the memory subsystem controller 115 can receive commands or operations from the host system 120 and can convert the commands or operations into instructions or appropriate commands to achieve the desired access to the memory devices 130 and/or the memory device 140. The memory subsystem controller 115 can be responsible for other operations such as wear leveling operations, garbage collection operations, error detection and error-correcting code (ECC) operations, encryption operations, caching operations, and address translations between a logical address (e.g., logical block address (LBA), namespace) and a physical address (e.g., physical block address) that are associated with the memory devices 130. The memory subsystem controller 115 can further include host interface circuitry to communicate with the host system 120 via the physical host interface. The host interface circuitry can convert the commands received from the host system into command instructions to access the memory devices 130 and/or the memory device 140 as well as convert responses associated with the memory devices 130 and/or the memory device 140 into information for the host system 120.

The memory subsystem 110 can also include additional circuitry or components that are not illustrated. In some embodiments, the memory subsystem 110 can include a cache or buffer (e.g., DRAM) and address circuitry (e.g., a row decoder and a column decoder) that can receive an address from the memory subsystem controller 115 and decode the address to access the memory devices 130.

In some embodiments, the memory devices 130 include local media controllers 135 that operate in conjunction with memory subsystem controller 115 to execute operations on one or more memory cells of the memory devices 130. An external controller (e.g., memory subsystem controller 115) can externally manage the memory device 130 (e.g., perform media management operations on the memory device 130). In some embodiments, a memory device 130 is a managed memory device, which is a raw memory device combined with a local controller (e.g., local controller 135) for media management within the same memory device package. An example of a managed memory device is a managed NAND (MNAND) device.

The memory subsystem 110 includes a buffer manager 113 that can dynamically adjust the at-risk data limit for the write buffer 145. In some embodiments, the controller 115 includes at least a portion of the buffer manager 113. For example, the controller 115 can include a processor 117 (processing device) configured to execute instructions stored in local memory 119 for performing the operations described herein. In some embodiments, a buffer manager 113 is part of the host system 120, an application, or an operating system.

The buffer manager 113 can manage the write buffer 145 at-risk data limit dynamically rather than setting it to a static value based upon a degraded state of backup capacitors. For example, the buffer manager 113 can use a greater at-risk data limit for the write buffer 145 during an initial period and reduce the limit size in response to a manual or automatic trigger. Further details with regards to the operations of the buffer manager 113 are described below.

Figure 2:
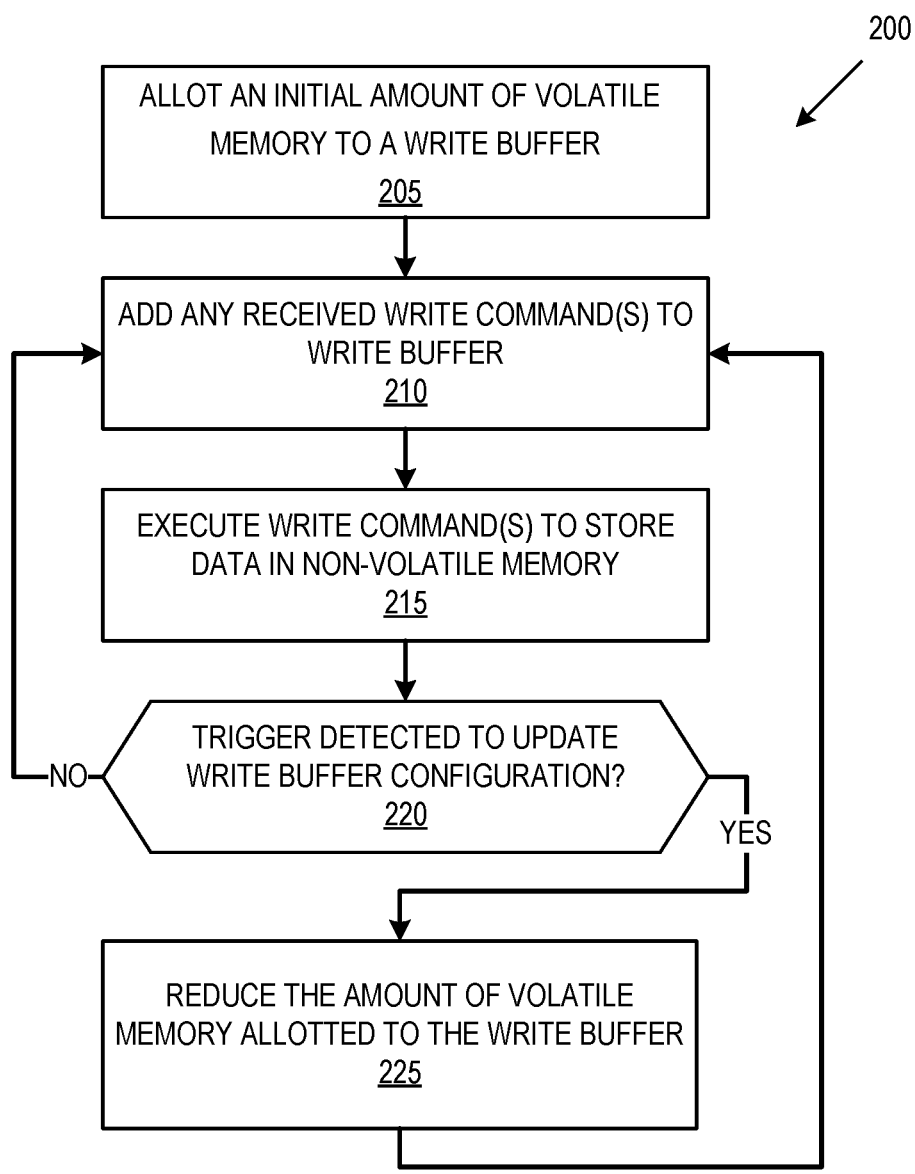
FIG. 2 is a flow diagram of an example method to dynamically adjust the at-risk data limit on a memory subsystem write buffer in accordance with some embodiments of the present disclosure.

FIG. 2 is a flow diagram of an example method 200 to dynamically adjust the at-risk data limit on a memory subsystem write buffer in accordance with some embodiments of the present disclosure. The method 200 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 300 is performed by the buffer manager 113 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 205, the processing device allots an initial amount of volatile memory to a write buffer. For example, the processing device can configure the write buffer to use an initial amount of volatile memory based upon the performance characteristics of one or more power backup capacitors at the beginning of life. In one embodiment, the processing device retrieves the initial amount from a lookup table or other data structure the local memory 119 of the memory subsystem controller 115 or from the non-volatile memory 130. In another embodiment, the processing device simulates a power loss event to test the capability of the capacitor(s) (e.g., how much backup power in terms of time the capacitor(s) are able to provide to complete writing buffered data and/or an amount of data written to non-volatile memory while on backup power) and configures the write buffer size based upon the determined capability of the capacitor(s).

At operation 210, the processing device adds data (or pointers to data) for any received write commands to the write buffer. For example, the processing device can receive write commands/requests from a host system and/or from an internal process, such as garbage collection. The write commands can be a part of an initial setup of the memory subsystem. For example, the installation of an operating system of a host system can include a series of write commands Additionally, the write commands can be a part of the normal operations of the host system and memory subsystem, e.g., writing data in the execution of one or more programs and/or folding data from garbage collection.

At operation 215, the processing device executes one or more write commands to commit the data stored in (or referenced by) the write buffer to non-volatile memory. For example, the processing device can aggregate data using the write buffer and commit data to non-volatile memory in write-sized portions. In one embodiment, the processing device writes in increments of a page of data at a time. In other embodiments, the processing device writes data in another increment, such as a portion of a page, multiple pages, a block, etc.

At operation 220, the processing device determines if a trigger condition is satisfied to update the at-risk data limit for the write buffer. In one embodiment, the trigger condition is a manual input from an administrator or other user. For example, following the installation of an operating system or otherwise performing an initial writing of a large amount of data, a user can send an instruction or other input to trigger the lowering of the at-risk data limit for the write buffer. In one embodiment, this trigger is intended to shift the memory subsystem from a high-throughput mode that takes advantage of the beginning of life capabilities of power backup capacitors into a normal mode with consistent write speeds over at least a portion of the life of the memory subsystem (e.g., based on one or more states of degradation of the capacitors).

In another embodiment, the trigger condition is detected or otherwise determined by the processing device. For example, the trigger can be satisfied by a predetermined amount of time elapsing following an initial event, such as the allotment of the initial amount of volatile memory to the write buffer or an initial power on event for the memory subsystem, detecting a threshold number of program/erase cycles performed by the memory subsystem, a measurement of capacitor performance, etc. In an embodiment in which capacitor performance is measured, the processing device can compare an amount of data that can be written in a power loss based upon the current capacitor performance to a current size of the write buffer. If the amount of data that can be written on backup power is less than the size of the write buffer, the processing device treats the measurement as a trigger to update the size of the write buffer.

If the processing device does not detect a trigger event, the method 200 returns to operation 210 to add received write commands to the write buffer, as described above. If the processing device detects a trigger event, the method 200 proceeds to operation 225.

At operation 225, the processing device reduces the amount of volatile memory allotted to the write buffer in response to determining the trigger condition is satisfied. For example, the processing device can configure the write buffer to use an updated/reduced amount of volatile memory based upon the performance characteristics of one or more power backup capacitors in a state of degradation or otherwise subsequent to the beginning of life. In one embodiment, the processing device retrieves the updated buffer size from a lookup table or other data structure the local memory 119 of the memory subsystem controller 115 or from the non-volatile memory 130. For example, the processing device can select an updated buffer size based on an amount of time elapsed, a number of program/erase cycles performed, or another memory subsystem metric or measurement. In one embodiment, the processing device simulates a power loss event to test the capability of the capacitor(s) (e.g., how much backup power in terms of time and/or data written to non-volatile memory during a power loss) and updates the write buffer size based upon the determined capability of the capacitor(s).

Following the reduction of size for the write buffer, the method 200 returns to operation 210 to add received write commands to the write buffer (if there is available space in the write buffer) and continues method 200 as described above. In one embodiment, the reduction of write buffer size is triggered more than once in the lifespan of the memory subsystem. As a result, the memory subsystem utilizes the backup power capabilities of the capacitor(s) and throttles the write speed less over the life of the memory subsystem as compared to only adjusting the write buffer size once. In another embodiment, the reduction of the write buffer size is triggered only once. As a result, under normal operations after updating the buffer size, the memory subsystem maintains a steady write speed, which can be preferred under certain quality of service (QoS) requirements.

Figure 3:
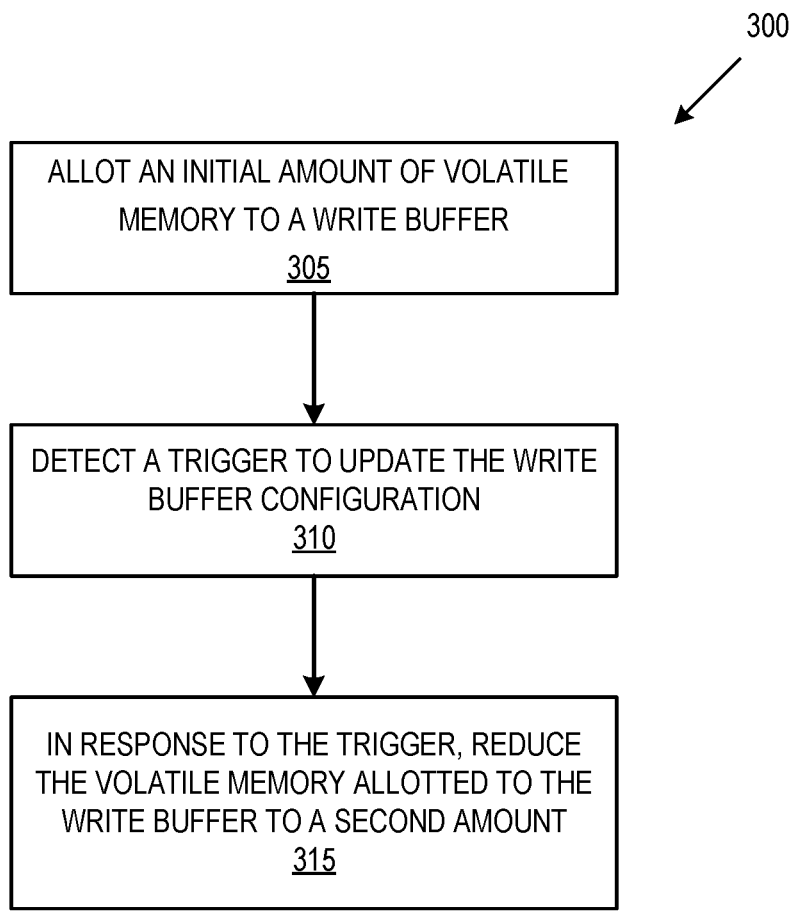
FIG. 3 is a flow diagram of another example method to dynamically adjust the at-risk data limit on a memory subsystem write buffer in accordance with some embodiments of the present disclosure.

FIG. 3 is a flow diagram of another example method 300 to dynamically adjust the at-risk data limit on a memory subsystem write buffer in accordance with some embodiments of the present disclosure, in accordance with some embodiments of the present disclosure. The method 300 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 300 is performed by the buffer manager 113 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 305, the processing device allots an initial amount of volatile memory to a write buffer. For example, the processing device can configure the write buffer as described above with reference to operation 205.

At operation 310, the processing device detects that a trigger condition is satisfied to update the at-risk data limit for the write buffer. For example, the processing device can detect the trigger event as described above with reference to operation 220.

At operation 315, the processing device reduces the amount of volatile memory allotted to the write buffer in response to detecting the trigger condition. For example, the processing device can configure the write buffer to use an updated amount of volatile memory as described above with reference to operation 225.

Figure 4:
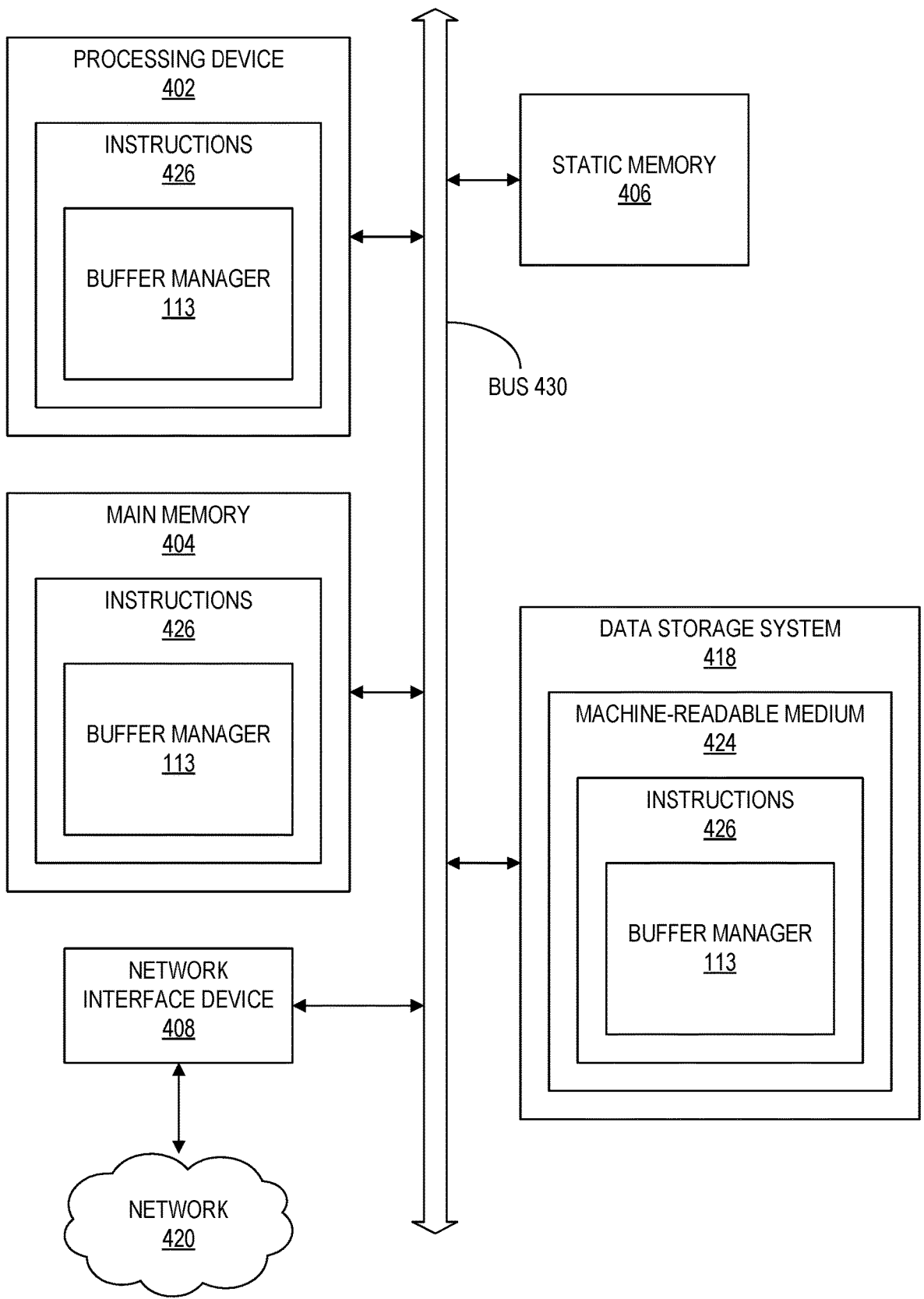
FIG. 4 is a block diagram of an example computer system in which embodiments of the present disclosure may operate.

FIG. 4 illustrates an example machine of a computer system 400 within which a set of instructions, for causing the machine to perform any one or more of the methodologies discussed herein, can be executed. In some embodiments, the computer system 400 can correspond to a host system (e.g., the host system 120 of FIG. 1) that includes, is coupled to, or utilizes a memory subsystem (e.g., the memory subsystem 110 of FIG. 1) or can be used to perform the operations of a controller (e.g., to execute an operating system to perform operations corresponding to the buffer manager 113 of FIG. 1). In alternative embodiments, the machine can be connected (e.g., networked) to other machines in a LAN, an intranet, an extranet, and/or the Internet. The machine can operate in the capacity of a server or a client machine in client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 400 includes a processing device 402, a main memory 404 (e.g., read-only memory (ROM), flash memory, dynamic random access memory (DRAM) such as synchronous DRAM (SDRAM) or Rambus DRAM (RDRAM), etc.), a static memory 406 (e.g., flash memory, static random access memory (SRAM), etc.), and a data storage system 418, which communicate with each other via a bus 430.

Processing device 402 represents one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 402 can also be one or more special-purpose processing devices such as an application specific integrated circuit (ASIC), a field programmable gate array (FPGA), a digital signal processor (DSP), network processor, or the like. The processing device 402 is configured to execute instructions 426 for performing the operations and steps discussed herein. The computer system 400 can further include a network interface device 408 to communicate over the network 420.

The data storage system 418 can include a machine-readable storage medium 424 (also known as a computer-readable medium) on which is stored one or more sets of instructions 426 or software embodying any one or more of the methodologies or functions described herein. The instructions 426 can also reside, completely or at least partially, within the main memory 404 and/or within the processing device 402 during execution thereof by the computer system 400, the main memory 404 and the processing device 402 also constituting machine-readable storage media. The machine-readable storage medium 424, data storage system 418, and/or main memory 404 can correspond to the memory subsystem 110 of FIG. 1.

In one embodiment, the instructions 426 include instructions to implement functionality corresponding to a buffer manager (e.g., the buffer manager 113 of FIG. 1). While the machine-readable storage medium 424 is shown in an example embodiment to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The present disclosure also relates to an apparatus for performing the operations herein. This apparatus can be specially constructed for the intended purposes, or it can include a general-purpose computer selectively activated or reconfigured by a computer program stored in the computer. For example, a computer system or other data processing system, such as the controller 115, may carry out the computer-implemented methods 200 and 300 in response to its processor executing a computer program (e.g., a sequence of instructions) contained in a memory or other non-transitory machine-readable storage medium. Such a computer program can be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various general-purpose systems can be used with programs in accordance with the teachings herein, or it can prove convenient to construct a more specialized apparatus to perform the method. The structure for a variety of these systems will appear as set forth in the description below. In addition, the present disclosure is not described with reference to any particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a process according to the present disclosure. A machine-readable medium includes any mechanism for storing information in a form readable by a machine (e.g., a computer). In some embodiments, a machine-readable (e.g., computer-readable) medium includes a machine (e.g., a computer) readable storage medium such as a read only memory ("ROM"), random access memory ("RAM"), magnetic disk storage media, optical storage media, flash memory components, etc.

In the foregoing specification, embodiments of the disclosure have been described with reference to specific example embodiments thereof. It will be evident that various modifications can be made thereto without departing from the broader spirit and scope of embodiments of the disclosure as set forth in the following claims. The specification and drawings are, accordingly, to be regarded in an illustrative sense rather than a restrictive sense.

What is claimed is:

1. A method comprising:
    simulating a power loss event;
    determining an amount of data written to non-volatile memory while on backup power during the simulated power loss event;
    configuring a size of a write buffer as a first amount of volatile memory using the determined amount of data, wherein the write buffer stores data to be written to non-volatile memory;
    detecting a trigger to update the size of the write buffer; and
    in response to detecting the trigger, reducing the size of the write buffer to a second amount of volatile memory.

2. The method of claim 1, wherein the trigger includes receiving an input to update the size of the write buffer.

3. The method of claim 1, wherein the trigger includes an amount of data written to the non-volatile memory satisfying a data threshold.

4. The method of claim 1, wherein the trigger includes an amount of time following the configuration of the size of the write buffer satisfying a time threshold.

5. The method of claim 4, further comprising:
determining the second amount of volatile memory based on the amount of time following the configuration of the size of the write buffer satisfying the time threshold.

6. The method of claim 1, further comprising:
detecting a second trigger to update the size of the write buffer; and
in response to detecting the second trigger, reducing the size of the write buffer from the second amount to a third amount.

7. The method of claim 1, wherein the second amount corresponds to an estimated degraded performance of capacitors that allow for completion of writing of the data to be written to the non-volatile memory from the write buffer during a power loss.

8. A non-transitory computer-readable storage medium comprising instructions that, when executed by a processing device, cause the processing device to:
simulate a power loss event;
determine an amount of data written to non-volatile memory while on backup power during the simulated power loss event;
configure a size of a write buffer as a first amount of volatile memory using the determined amount of data, wherein the write buffer stores data to be written to non-volatile memory;
detect a trigger to update the size of the write buffer; and
in response to detecting the trigger, reduce the size of the write buffer to a second amount of volatile memory.

9. The non-transitory computer-readable storage medium of claim 8, wherein the trigger includes receiving an input to update the size of the write buffer.

10. The non-transitory computer-readable storage medium of claim 8, wherein the trigger includes an amount of data written to the non-volatile memory satisfying a data threshold.

11. The non-transitory computer-readable storage medium of claim 8, wherein the trigger includes an amount of time following the configuration of the size of the write buffer satisfying a time threshold.

12. The non-transitory computer-readable storage medium of claim 11, wherein the processing device is further to:
determine the second amount of volatile memory based on the amount of time following the configuration of the size of the write buffer satisfying the time threshold.

13. The non-transitory computer-readable storage medium of claim 8, wherein the processing device is further to:
detect a second trigger to update the size of the write buffer; and
in response to detecting the second trigger, reduce the size of the write buffer from the second amount to a third amount.

14. The non-transitory computer-readable storage medium of claim 8, wherein the second amount corresponds to an estimated degraded performance of capacitors that allow for completion of writing of the data to be written to the non-volatile memory from the write buffer during a power loss.

15. A system comprising:
a plurality of memory devices; and
a processing device, operatively coupled with the plurality of memory devices, to:
simulate a power loss event;
determine an amount of data written to non-volatile memory while on backup power during the simulated power loss event;
configure a size of a write buffer as a first amount of volatile memory using the determined amount of data, wherein the write buffer stores data to be written to non-volatile memory;
detect a trigger to update the size of the write buffer;
determine a second amount of volatile memory based on estimated degraded performance of capacitors that allows for completion of writing of the data from the write buffer during a power loss; and
in response to detecting the trigger, reduce the size of the write buffer to the second amount of volatile memory.

16. The system of claim 15, wherein the trigger includes receiving an input to update the size of the write buffer.

17. The system of claim 15, wherein the trigger includes an amount of data written to the non-volatile memory satisfying a data threshold.

18. The system of claim 15, wherein the trigger includes an amount of time following the configuration of the size of the write buffer satisfying a time threshold.

19. The system of claim 18, wherein the processing device is further to:
determine the second amount of volatile memory based on the amount of time following the configuration of the size of the write buffer satisfying the time threshold.

20. The system of claim 15, wherein the processing device is further to:
detect a second trigger to update the size of the write buffer; and
in response to detecting the second trigger, reduce the size of the write buffer from the second amount to a third amount.

* * * * *